(12) United States Patent
Watson et al.

(10) Patent No.: US 7,971,129 B2
(45) Date of Patent: Jun. 28, 2011

(54) CODE GENERATOR AND DECODER FOR COMMUNICATIONS SYSTEMS OPERATING USING HYBRID CODES TO ALLOW FOR MULTIPLE EFFICIENT USERS OF THE COMMUNICATIONS SYSTEMS

(75) Inventors: Mark Watson, San Francisco, CA (US); Michael G. Luby, Berkeley, CA (US)

(73) Assignee: Digital Fountain, Inc., San Diego, CA (US)

( * ) Notice: Subject to any disclaimer, the term of this patent is extended or adjusted under 35 U.S.C. 154(b) by 1083 days.

(21) Appl. No.: 11/747,191

(22) Filed: May 10, 2007

(65) Prior Publication Data

US 2007/0300127 A1   Dec. 27, 2007

Related U.S. Application Data

(60) Provisional application No. 60/799,536, filed on May 10, 2006.

(51) Int. Cl.
*H03M 13/00* (2006.01)
(52) U.S. Cl. ......... 714/784; 365/200; 714/752; 714/758
(58) Field of Classification Search .................. 714/752, 714/758, 784; 365/200
See application file for complete search history.

(56) References Cited

U.S. PATENT DOCUMENTS

| | | | |
|---|---|---|---|
| 5,699,473 A * | 12/1997 | Kim | ................................ 386/67 |
| 6,041,001 A * | 3/2000 | Estakhri | ....................... 365/200 |
| 6,307,487 B1 | 10/2001 | Luby | |
| 6,614,366 B2 | 9/2003 | Luby | |
| 6,856,263 B2 | 2/2005 | Shokrollahi et al. | |
| 7,068,729 B2 | 6/2006 | Shokrollahi et al. | |
| 7,559,004 B1 * | 7/2009 | Chang et al. | ................... 714/758 |
| 2003/0037299 A1 * | 2/2003 | Smith | ........................... 714/763 |
| 2003/0058958 A1 | 3/2003 | Shokrollahi et al. | |
| 2003/0101408 A1 | 5/2003 | Martinian et al. | |
| 2005/0028067 A1 * | 2/2005 | Weirauch | ...................... 714/758 |
| 2005/0257106 A1 | 11/2005 | Luby et al. | |
| 2006/0036930 A1 | 2/2006 | Luby et al. | |

OTHER PUBLICATIONS

IETF RFC 2733: Rosenberg, J. et al. "An RTP Payload Formal for Generic Forward Error Correction," Network Working Group, RFC 2733 (Dec. 1999).
International Preliminary Report on Patentability, PCT/US2007/068713—The International Bureau of WIPO—Geneva, Switzerland, Nov. 11, 2008.
Written Opinion, PCT/US2007/068713—International Search Authority—US, Jan. 7, 2008. Goyal, "Multiple Description Coding: Compression Meets the Network," In Signal Processing Magazine, IEEE, vol. 18, Issue 5, (Sep. 2001) pp. 74-93. URL:http://www.rle.mit.edu/stir/documents/Goyal_SigProcMag2001_ MD.pdf [Nov. 4, 2007].
International Search Report PCT/US07/68713.

* cited by examiner

*Primary Examiner* — Sam Rizk
(74) *Attorney, Agent, or Firm* — Jeffrey D. Jacobs

(57) ABSTRACT

A method of encoding data for transmissions from a source to a destination over a communications channel is provided. The method operates on an ordered set of source symbols and may generate zero or more redundant symbols from the source symbols, wherein data is encoded in a first step according to a simple FEC code and in a second step, data is encoded according to a second FEC code, more complex than the first FEC code. The first FEC code and/or the second FEC code might comprise coding known in the art. These steps result in two groups of encoded data in such a way that a low-complexity receiver may make use of one of the groups of encoded data while higher complexity receivers may make use of both groups of encoded data.

35 Claims, 5 Drawing Sheets

CODE GENERATOR AND DECODER FOR COMMUNICATIONS SYSTEMS OPERATING USING HYBRID CODES TO ALLOW FOR MULTIPLE EFFICIENT USERS OF THE COMMUNICATIONS SYSTEMS

CROSS-REFERENCES

This application claims priority from and is a non-provisional of U.S. Provisional Patent Application No. 60/799,536 filed May 10, 2006.

The following references are include here and are incorporated by reference for all purposes:

U.S. Pat. No. 6,307,487 entitled "Information Additive Code Generator and Decoder for Communication Systems" issued to Luby (hereinafter "Luby I");

U.S. Published Patent Application No. 2005/0257106 published Nov. 17, 2005 and entitled "File Download and Streaming System" to Luby, et al. (hereinafter "Luby II");

U.S. Pat. No. 7,068,729 entitled "Multi-Stage Code Generator and Decoder for Communication Systems" issued to Shokrollahi, et al. (hereinafter "Shokrollahi I");

U.S. Published Patent Application No. 2006/0036930 published Feb. 16, 2006 and entitled "Method and Apparatus for Fast Encoding of Data Symbols According to Half-Weight Codes" to Luby, et al. (hereinafter "Luby III"); and U.S. Pat. No. 6,856,263 entitled "Systems and Processes for Decoding Chain Reaction Codes Through Inactivation" issued to Shokrollahi, et al. (hereinafter "Shokrollahi II").

FIELD OF THE INVENTION

The present invention relates to encoding and decoding data in communications systems, and more specifically to communication systems that encode and decode data to account for errors and gaps in communicated.

BACKGROUND OF THE INVENTION

Transmission of files and streams between a sender and a recipient over a communications channel has been the subject of much literature. Preferably, a recipient desires to receive an exact copy of data transmitted over a channel by a sender with some level of certainty. Where the channel does not have perfect fidelity, which characterizes most physically realizable systems, one concern is how to deal with data that is lost or corrupted in transmission. Lost data (erasures) are often easier to deal with than corrupted data (errors) because the recipient cannot always recognize when the transmitted data has been corrupted.

Many error-correcting codes have been developed to correct erasures and/or errors. Typically, the particular code used is chosen based on some information about the infidelities of the channel through which the data is being transmitted, and the nature of the data being transmitted. For example, where the channel is known to have long periods of infidelity, a burst error code might be best suited for that application. Where only short, infrequent errors are expected, a simple parity code might be best.

"Communication", as used herein, refers to data transmission, through space and/or time, such as data transmitted from one location to another or data stored at one time and used at another. The channel is that which separates the sender and receiver. Channels in space can be wires, networks, fibers, wireless media, etc. between a sender and receiver. Channels in time can be data storage devices. In realizable channels, there is often a nonzero chance that the data sent or stored by the sender is different when it is received or read by the recipient and those differences might be due to errors introduced in the channel.

Data transmission is straightforward when a transmitter and a receiver have all of the computing power and electrical power needed for communications, and the channel between the transmitter and receiver is reliable enough to allow for relatively error-free communications. Data transmission becomes more difficult when the channel is in an adverse environment, or the transmitter and/or receiver has limited capability. In certain applications, uninterrupted error-free communication is required over long periods of time. For example, in digital television systems it is expected that transmissions will be received error-free for periods of many hours at a time. In these cases, the problem of data transmission is difficult even in conditions of relatively low levels of errors.

Another scenario in which data communication is difficult is where a single transmission is directed to multiple receivers that may experience widely different data loss conditions. Furthermore, the conditions experienced by one given receiver may vary widely or may be relatively constant over time.

One solution to dealing with date loss (errors and/or erasures) is the use of forward error correcting (FEC) techniques, wherein data is coded at the transmitter in such a way that a receiver can correct transmission erasures and errors. Where feasible, a reverse channel from the receiver to the transmitter allows for the receiver to relay information about these errors to the transmitter, which can then adjust its transmission process accordingly. Often, however, a reverse channel is not available or feasible, or is available only with limited capacity. For example, in cases in which the transmitter is transmitting to a large number of receivers, the transmitter might not be able to maintain reverse channels from all the receivers. In another example, the communication channel may be a storage medium.

Thus, data is transmitted chronologically forward through time, and causality precludes a reverse channel that can fix errors before they happen. As a result, communication protocols often need to be designed without a reverse channel or with a limited capacity reverse channel and, as such, the transmitter may have to deal with widely varying channel conditions without prior knowledge of those channel conditions.

In the case of a packet protocol used for data transport over a channel that can lose packets, a file, stream, or other block of data to be transmitted over a packet network is partitioned into equally-sized source symbols. Encoding symbols the same size as the source symbols are generated from the source symbols using an FEC code, and the encoding symbols are placed and sent in packets. The "size" of a symbol can be measured in bits, whether or not the symbol is actually broken into a bit stream, where a symbol has a size of M bits when the symbol is selected from an alphabet of $2^M$ symbols. In such a packet-based communication system, a packet oriented erasure FEC coding scheme might be suitable.

A file transmission is called reliable if it allows the intended recipient to recover an exact copy of the original file despite erasures in the network. A stream transmission is called reliable if it allows the intended recipient to recover an exact copy of each part of the stream in a timely manner despite erasures in the network. Both file transmission and stream transmission can instead be not entirely reliable, but somewhat reliable, in the sense that some parts of the file or stream are not recoverable or, for streaming, some parts of the stream might be recoverable but not in a timely fashion.

Packet loss often occurs because sporadic congestion causes the buffering mechanism in a router to reach its capacity, forcing it to drop incoming packets. Protection against erasures during transport has been the subject of much study.

In a system in which a single transmission is directed to more than one receiver, and in which different receivers experience widely different conditions, transmissions must be configured for the worst conditions between the transmitter and any receiver, i.e., it must be assumed that some receivers will not receive the transmission reliably.

Erasure codes are known which provide excellent recovery of lost packets in such scenarios. For example, Reed-Solomon codes are well known and can be adapted to this purpose. However, a known disadvantage of Reed-Solomon codes is their relatively high computational complexity. Chain reaction codes, including LT™ chain reaction codes and Raptor™ multi-stage chain reaction ("MSCR") codes, provide excellent recovery of lost packets, and are highly adaptable to varying channel conditions. See, for example, Luby I, which describes aspects of chain reaction codes, and Shokrollahi I, which describes aspects of multi-stage chain reaction codes. Herein, the term "chain reaction code" should be understood to include chain reaction codes or multi-stage chain reaction codes, unless otherwise indicated.

As a general rule, erasure codes that are capable of correcting large amounts of lost data have a greater cost in terms of computational complexity, device hardware and software complexity, and/or memory requirements than those codes which are designed only for very limited levels of errors. In particular, as is well known, a simple parity code can be used to correct a single lost symbol among a group of any given size. The complexity of encoding and decoding such a code is very low. Interleaved parity codes are well known as a technique for correcting bursts of lost symbols that are shorter than or equal to the interleave depth. Such codes also have very low encoding and decoding complexity.

A disadvantage of known techniques is that if losses for some receivers are such that a more powerful erasure correction code must be employed, then all receivers need to provide support for this powerful code, implying costs in terms of complexity, memory, etc. for all receivers. As a result, initial deployments of systems may be based on less complex and less powerful codes, with an objective of upgrading the system to more powerful codes as required.

The "flag day" problem is a well-known problem that is difficult to solve in practice. The flag day problem occurs in large communication systems involving many devices (senders and receivers) when it becomes necessary to upgrade all deployed devices (e.g., receivers) simultaneously in order to deploy an upgraded service. The flag day problem has delayed or prevented the implementation of a number of desirable upgrades to systems in cases in which the upgrade is characterized by the precondition that all devices need to be updated before the system will work correctly, i.e., the system will not even perform at pre-upgrade levels if some devices have been upgraded and other devices have not. It is therefore desirable that an upgrade path be designed to be more or less seamless, in that the system can function at least as well during the upgrade period as it did before the upgrade began, even when some of the devices have been upgraded and others have not. This can be a large problem if a full upgrade would take a prolonged period of time. In such cases, a seamless upgrade path is highly desirable but is often difficult to accomplish.

BRIEF SUMMARY OF THE INVENTION

According to one embodiment of the invention, a method of encoding data for transmissions from a source to a destination over a communications channel is provided. The method operates on an ordered set of source symbols and may generate zero or more redundant symbols from the source symbols, wherein data is encoded in a first step according to a first FEC code and in a second step, data is encoded according to a second FEC code, more complex than the first FEC code. The first FEC code might be a simple erasure code and the second a more complex erasure code. The first FEC code and/or the second FEC code might comprise coding known in the art. These steps result in two groups of encoded data in such a way that a low-complexity receiver may make use of one of the groups of encoded data while higher complexity receivers may make use of both groups of encoded data, providing more error protection than either FEC code alone.

According to another embodiment of the invention, a method of receiving data transmitted over a communications channel is provided, the method comprising the step of combining the two groups of data in such a way that a greater number of errors can be corrected than if each group of data were processed independently according to the decoding procedures associated with the two respective codes.

As will be clear to those of skill in the art upon review of this disclosure, the methods described herein can be naturally extended to support more than two distinct FEC codes, maintaining the property that, at the receiver, data from more than one of the transmitted codes can be combined in a way that provides for greater error correction than if the data were processed independently according to the procedures associated with the respective codes.

A better understanding of the nature and the advantages of the embodiments disclosed herein may be realized by reference to the remaining portions of the specification.

BRIEF DESCRIPTION OF THE DRAWINGS

A further understanding of the nature and the advantages of the inventions disclosed herein may be realized by reference to the remaining portions of the specification and the attached drawings.

DETAILED DESCRIPTION OF SPECIFIC EMBODIMENTS

Figure 1:
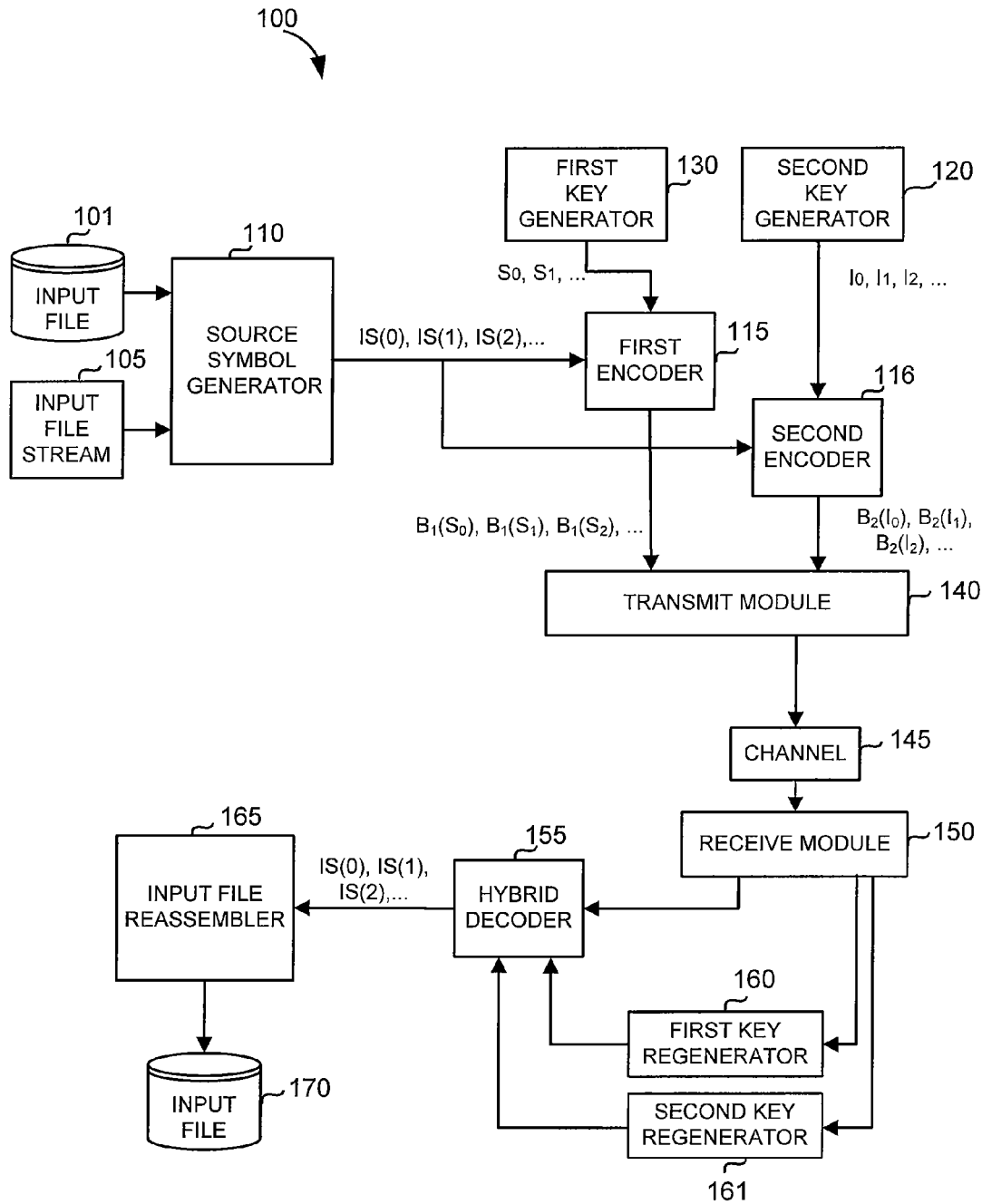
FIG. 1 is a block diagram of a communications system that can use the hybrid coding techniques described herein.

It is to be understood that the various functional blocks described herein may be implemented by a combination of hardware and/or software, and that in specific implementations some or all of the functionality of some of the blocks may be combined. Similarly, it is also to be understood that the various methods described herein may be implemented by a combination of hardware and/or software. Thus, where a computational step is performed, which might be described as "we then do step X", it should be understood that such descriptions include electronic hardware and/or software, or the like, performing those steps, typically as part of a communications process and not involving human or manual interaction.

In embodiments described herein, data to be encoded is segmented into "source blocks," each block comprising a number of packets of data, known as "source packets," with the number of source packets in a block possibly varying between blocks. For each source block, a number of "FEC repair" packets are generated by the encoder, the number also possibly varying between blocks. "Source packets" and "FEC repair", (or "repair") packets have the characteristic that a receiver receiving a combination of source and repair packets greater than or equal in number to the number of source packets has some non-zero probability of recovering all the source packets.

Seamless Upgrade Paths

There are a variety of reasons why a full upgrade may take a prolonged period of time. For example, it could be the case that older devices may not have the capability to support the upgraded system due to limitations in computational resources or memory. As another example, some devices are designed with the characteristic that they cannot be upgraded, and thus the upgrade can only occur when the device is replaced with a new device in which the upgrade is already installed. In other cases, even if in theory an upgrade is possible, it may in practice be too expensive or risky to upgrade a large number of devices because of the expense of installing upgrade software remotely on millions of devices and making sure that the upgrade is working correctly, as well as troubleshooting problems during installation, etc. Furthermore, if there are a large number of devices installed and they all need to be upgraded before the system is operational again, then it could be practically impossible to shut down the system during the upgrade, as would be the case with a large operational deployment of an IPTV service with millions of receivers, which could take days or weeks to fully upgrade.

In such cases, a seamless upgrade path is highly desirable but is often difficult to accomplish.

With respect to deployment of FEC protection of streaming data within a system that did not previously use FEC, there is a well-known seamless upgrade path. The way this is done is to design the application of the FEC in such a way that the original stream is still sent, and then additional FEC repair data is sent in a logically separate stream that can be used by upgraded receivers to support a much higher quality stream playout, while at the same time older receivers that have not been upgraded can simply ignore the FEC repair data and still operate as before using the original stream of data. The possibility of this seamless upgrade path is one of the primary reasons that systematic FEC codes are preferable for streaming applications. A systematic FEC code has the property that the original data is included and sent as part of the FEC encoded data, and in this context the additional FEC data that is generated and sent is called the FEC repair data.

However, as more and more receivers are added to a system, then the worst case channel conditions to which the FEC must be adapted become worse, and more powerful FEC codes are required. There is then no known efficient seamless update path, i.e., from a system that already uses FEC to a system that uses a more powerful FEC. For example, one such possible seamless upgrade path is to just simply encode the stream using both the original FEC code and the more powerful FEC code during the transition and to send the FEC repair data for both codes. However, this solution sends a lot more FEC repair data than is required for a given quality of protection. Another possible upgrade path is to simply stop sending the FEC repair data from the less powerful FEC code and only send the FEC repair data from the more powerful FEC code during the transition. However, this has the undesirable property that during the transition the older receivers that are not upgraded will receive a worse service during the upgrade transition than they did before the upgrade initiated. Thus, what is desired is an efficient and seamless upgrade path for introducing more powerful FEC codes in systems where less powerful FEC codes have already been deployed.

In another technique, FEC repair data is distributed across a number of "channels" where receivers may choose whether or not to receive each channel. Receivers experiencing good channel conditions may limit the number of channels received. For example, such a technique can be applied to wireless systems in which each channel corresponds to a different radio frequency or other means of multiplexing data. Another example occurs in the field of Internet Protocol networks where a channel may correspond to a multicast group which a receiver can leave or join as required.

One possible solution is to FEC encode the data to be transmitted twice, once with a low complexity FEC code and once with a more powerful FEC code, and then send the FEC repair data for the different FEC codes over different channels. It is possible that, within at least some of the system, both transmission channels are carried. In particular, in the case of wireless systems, both transmission channels are carried over the wireless link. In the case of Internet Protocol networks, both transmission channels may be carried as far as the last hop router before each receiver.

In one embodiment each receiver uses FEC repair data from only one of the two channels, i.e., the FEC repair data associated with one of the two FEC codes, even in the case of a receiver equipped with a FEC decoder for both FEC codes. In this embodiment, the quality of the decoded stream does not necessarily reflect the quality that could be obtained by using both FEC repair data streams to decode, and thus other embodiments may work better.

Receivers

In some embodiments, a receiver that is equipped with both FEC decoders receives and decodes using the FEC repair data from both channels, i.e., from both FEC codes. For example, a receiver may decode as much as possible of the original data stream alternatively using the FEC repair data from one of the two channels followed by using the FEC repair data from the other of the two channels, together with whatever original data is received. As another example the receiver may immediately combine the FEC repair data from both channels and use it together to decode the original data stream, e.g., if the FEC repair data for both channels is linear combinations of the original data then the receiver may solve a linear system of equations based on the combined set of FEC repair data received from both FEC codes, together with whatever original data is received. These are preferred embodiments, because they allow a seamless upgrade path. For example, an efficient seamless upgrade path may be enabled by a first FEC code that is simple and can generate only a few FEC repair symbols per original source block of data, using relatively simple procedures at the receiver to regenerate the missing pieces of the original source blocks of data from the FEC repair data, using limited expenditure of computational resources, memory etc., and a second FEC code that is more powerful and can generate more FEC repair symbols per original source block of data that may use more advanced procedures at a more sophisticated receiver to regenerate the missing pieces of the original source blocks of data by processing the combined FEC repair data from the first and second FEC codes.

During the deployment of systems such as those considered here, in which, for example, a single transmission is directed towards multiple receivers each experiencing different conditions in terms of data loss, it is common to provide support for receivers in phases, with those receivers experiencing low loss conditions receiving service at an earlier phase in the development of the system. This approach is advantageous in terms of capital investment, since deployment of complex and expensive functionality to deal with high loss cases can be delayed until the demand for and effectiveness of the system in question has been tested. Furthermore, during the early deployment phases of such systems, priority is often given to more fundamental operational issues.

Thus, another desirable property of such an FEC code is that encoding and decoding of the first group of packets also requires relatively low computational resources. This allows for development and deployment of lower cost transmitters and receivers during the early phases of system deployment.

Hybrid Coder

In this embodiment, the first repair packets sent for a block are generated using a low-complexity erasure code which is known to perform well in the case that only a very few source packets (perhaps as few as one) are lost. Additional repair packets are generated using a second erasure code. In one specific embodiment, the first code may be a single parity packet calculated across all of the source packets in the block, such as an FEC code specified in IETF RFC 2733 and the second code may be a chain reaction code, such as those described in Shokrollahi I or Luby I. In another specific embodiment, the first code may be a small number of repair packets from a high rate Reed-Solomon code. In another embodiment, the first code is a simple interleaved parity code and the second code may be a chain reaction code. In a further embodiment, the second code is a Reed-Solomon code.

At a receiver, which receives one or more repair packets of the first FEC code, decoding may first be attempted using a decoding method appropriate for the first FEC code. In the case where the first FEC code alone is not sufficient to recover all lost source packets at the receiver, received first FEC code repair packets may be combined with received repair packets from the second FEC code and used to recover lost source packets in such a way that the number of recovered source packets may be greater than if each FEC code were decoded independently and furthermore greater than if one code were processed first and the output of this operation used as input to the decoding operation of the second code.

Herein, coding methods that provide for two (or more) FEC codes wherein two (or more) of those codes can be used together are referred to herein as "hybrid code" methods. Some decoders, when receiving data encoded according to a hybrid code method, will decode using available source packets (where the coding is at least in part systematic; encoded packets for nonsystematic coding or the like would be used instead) and first repair packets containing symbols of a first FEC repair code, while other decoders could use first FEC code packets and second FEC code packets (and third, etc., where more than two are used). In yet other variations, the simple decoder uses more than one FEC code stream, but fewer code streams than the more complex decoder.

The use of hybrid code methods has an advantage over using the repair packets of the second code alone and independently of the first code repair packets, since a given quality target can be achieved with overall lower overhead.

The hybrid code approach has advantages in cases where the second FEC code does not perform well at very low overhead. Some advantages include that the resulting hybrid code is more flexible than the second FEC code alone, since the "same" code is applicable in both very low loss and higher loss scenarios. Another advantage, in cases where receivers experience variable loss rates, is that if a very low-complexity first code is chosen then only the first code needs to be processed when loss rates are low and the computational load (at that time) is very low. Where receivers designed are only for low-loss scenarios, they advantageously need only implement the first FEC code part of the hybrid code.

Some or all of the above advantages would be obtained in embodiments of encoders, decoders and/or communications system according to the present invention.

Relationship Between Packets and Symbols

As described above, forward erasure correction codes operate on symbols chosen from a fixed alphabet. For example, the symbols may be chosen from an alphabet of size $2^M$ in which case there is an obvious mapping between symbols and strings of M binary digits. Such symbols are hereinafter referred to as having a size of M bits. Data is often sent over a communications channel in the form of packets. In some cases, there is a one-to-one mapping between symbols and packets. In other cases, including for example those described in Luby II, packets may be larger than symbols, with a packet comprising several symbols. Additionally, symbols and packets may comprise the same data but the bit order and placement may differ, or additional information may be placed into the FEC symbols which is not contained within the packet, for example a binary representation of the packet length. Equally, data may be present in packets which is not present in the FEC symbols, for example information added to a packet to indicate which FEC symbols it contains or data that does not need to be protected by the FEC code, for example because it comprises fields that are not used or have the same value in every packet or because it could be recovered in other ways.

In the case of hybrid codes, to obtain some of the advantages, the symbols of the first code and those of the second code will have certain relationships. Specifically, a source symbol of the first code will comprise the data of one or more source symbols of the second code. It should be understood that the source symbols of the first code may be a different size from those of the second code, that there may be information in symbols of the first code that is not present in the symbols of the second code and that where a source symbol of the first code comprises the data of one of the source symbols of the first code this means only that knowledge of the source symbol of the second code could be obtained from knowledge of the source symbol of the first code and not, for example, that the source symbol of the first code contains a verbatim copy of the source symbol of the second code.

Relationship Between Source Blocks

Many forward error correction codes operate on discrete collections of source symbols, known as source blocks. For example, a source block may comprise all the source symbols of a file, or all the source symbols of a particular fragment in time of a streaming service.

In the case of hybrid codes, to obtain some of the advantages, the source blocks of the first code and those of the second code will have certain relationships. Specifically, the source blocks of the first code preferentially should each be a subset of a source block of the second code. More precisely, given a source block of the first code, a number of the source symbols of the second code may be obtained according to the section "Relationship between packets and symbols" herein and these source symbols preferentially should all be part of the same source block of the second code.

Figure 4:
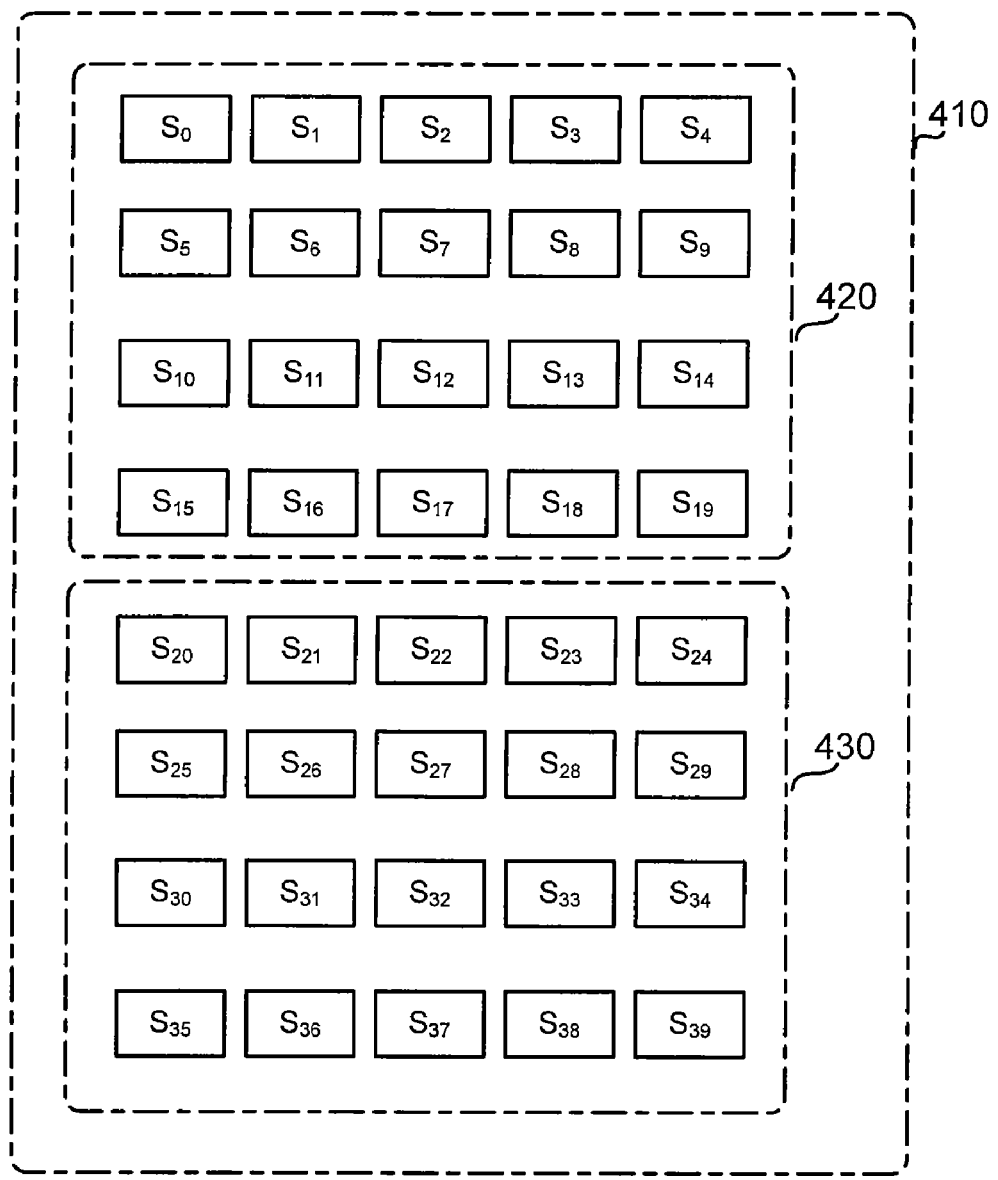
FIG. 4 is an illustration of an example of relationships between source blocks of a first code and a second code according to aspects of the present invention.

An example of a possible relationship between source blocks of the first and second codes is illustrated in FIG. 4, which shows a source block of a Second FEC code 410 constructed from 40 source packets, $S_0, S_1, \ldots, S_{39}$. Also shown are two source blocks of a First FEC code, 420 and 430, each constructed from 20 packets taken from the same set of 40 packets.

As will be apparent to those of skill in the art of FEC coding upon review of this disclosure, many other arrangements are possible. For example, the source blocks of the first FEC code need not each be the same size as each other and the source blocks of the second FEC code need not be the same size as each other. It need not be the case that every packet is a member of a single first FEC code source block and it need not be the case that every packet of a second FEC code source block is also a member of a first FEC code source block.

Generalized Matrix Description of Systematic Forward Erasure Correction Codes

We now describe a generalized method of encoding and decoding systematic forward erasure correction codes. As is well-known, a large class of codes can be represented in the form described here and encoded and decoded by the method described here. In some cases alternative methods exist which offer improvements in computational complexity, either at the encoder or decoder or both. The general method described here will later be used to describe the method by which repair packets of a first code can be combined with those of a second code. This method may be applied whether or not either of the codes are encoded or decoded using the generalized method or some other method.

In many forward erasure correction codes, each repair symbol can be expressed as a linear sum of the source symbols over some finite field. Methods for the use of such linear combinations within the field of FEC codes are well known and are described in detail for example in Shokrollahi I, Shokrollahi II and Luby III.

In such cases, a method of encoding is obtained by simply calculating the required linear combination for each repair symbol. This operation can be viewed as the operation of a matrix on a column vector comprising the source symbols, the matrix comprising a number of columns equal to the number of source symbols and one row for each repair symbol, where the entries of this row are the coefficients of the source symbols in the linear combination which is equal to that repair symbol. A method of decoding can be obtained by constructing a matrix comprising those rows of the encoding matrix corresponding to received repair symbols. The well-known method of Gaussian elimination can then be applied to recover the missing source symbols as linear combinations of the received symbols, if such recovery is possible at all.

In practice, many methods exist for performing calculations equivalent to those described above using fewer primitive operations than those required in the straightforward approach by making use of specific properties of the particular FEC code. Some such methods are taught by Shokrollahi I, Shokrollahi II and Luby III. In the description below, the generalized matrix description is used in the description of novel techniques which apply to a large number of different FEC codes, but it should be understood that in practice methods optimized for particular codes may be used in conjunction with the novel techniques described.

Erasure codes which can be represented in this form include the simple parity code in which there is a single repair packet for each source block, with the repair packet being constructed as the exclusive OR (XOR) of the source packets, i.e., the linear sum of the source packets in the finite field GF(2). Another example is an interleaved parity code, in which there is a number, n, of repair packets, with indices $0, \ldots, n-1$ where the repair packet with index i is equal to the sum of those source packets whose index s satisfies $(s \% n)=i$.

Another example is a Reed-Solomon code, one example of which may be obtained if the matrix is a Vandermonde matrix.

Generalized Matrix Description of Certain Systematic Chain Reaction Codes

Also described herein is a generalized matrix description of certain systematic chain reaction codes in which columns of the matrix represent "intermediate symbols" and rows of the matrix represent "source," "repair," and "static" symbols.

The entries of such a matrix are taken from a finite field $GF(2^q)$, although in some regions of the matrix, the choice of elements may be restricted to those in the image of some smaller finite field, $GF(2^p)$ for $p<q$ according to some embedding of $GF(2^p)$ into $GF(2^q)$.

This matrix expresses the relationships between source symbols and repair symbols, via the intermediate symbols, in the following way:

(1) There is one matrix row for each source symbol, which expresses that source symbol as a linear combination of the intermediate symbols; that is, the product of a row vector equal to the row in question with a column vector of the intermediate symbols is equal to the source symbol in question;

(2) There is one matrix row for each repair symbol, which expresses that repair symbol as a linear combination of the intermediate symbols; that is, the product of a row vector equal to the row in question with a column vector of the intermediate symbols is equal to the repair symbol in question;

(3) There are zero or more static rows, each of which identifies a linear combination of the intermediate symbols which is constrained to be equal to the zero symbol; that is, the product of a row vector equal to the row in question with a column vector of the intermediate symbols is equal to the zero symbol.

The combination of source symbols and static rows form an invertible matrix. Encoding can be performed by constructing the matrix comprising the rows corresponding to the static symbols and the source symbols, finding its inverse (for example, by Gaussian elimination), using this inverse to calculate the intermediate symbols from the source symbols. Once the intermediate symbols have been calculated then repair symbols may be constructed as linear combinations of the intermediate symbols as indicated by the matrix rows corresponding to the repair symbols.

Decoding can be performed by constructing the matrix comprising the rows corresponding to the static symbols and all received symbols (source and repair). If this matrix is of full rank, then an invertible sub-matrix can be found (for example by Gaussian elimination) which allows all the intermediate symbols to be recovered. The missing source symbols can then be constructed as the appropriate linear combinations of intermediate symbols.

Encoder Implementation

FIG. 1 is a block diagram of a communications system 100 that uses coding that might include the hybrid coding described herein.

In communications system 100, an input file 101, or an input stream 105, is provided to a source symbol generator 110. Source symbol generator 110 generates a sequence of one or more source symbols (IS(0), IS(1), IS(2), ...) from the input file or stream, with each source symbol having a value and a position (denoted in FIG. 1 as a parenthesized integer). As explained above, the possible values for source symbols, i.e., its alphabet, is typically an alphabet of $2^M$ symbols, so that each source symbol codes for M bits of the input file. In the case where the first FEC code and the second FEC code use source symbols of different sizes, then source symbol generator 110 may generate symbols of both sizes. The value or values of M is/are generally determined by the use of communication system 100, but a general purpose system might include a symbol sizes input for source symbol generator 110 so that the values of M can be varied from use to use. The output of source symbol generator 110 is provided to a first FEC code encoder 115 and a second FEC code encoder 116.

First key generator 130 produces a stream of keys $S_0$, $S_1$, .... The number of the keys generated is generally limited and depends on the specific embodiment of encoder 115. The generation of first FEC code keys will be subsequently described in more detail, as used for a first FEC code. Second key generator 120 generates a key for each output symbol to be generated by the second FEC code encoder 116. Each key may be generated so that a large fraction of the keys for the same input file are unique. For example, Luby I describes embodiments of key generators that can be used. The outputs of second key generator 120 are provided to the second FEC code encoder 116.

From each key S provided by the first key generator 110, encoder 115 generates an output symbol, with a value $B_1(I)$, from the source symbols provided by the source symbol generator. The operation of first encoder 115 is described in more detail below. The value of each output symbol is generated based on its key and on some function of one or more of the source symbols.

From each key I provided by the second key generator 120, encoder 116 generates an output symbol, with a value $B_2(I)$, from the source symbols provided by the source symbol generator. The operation of second encoder 116 will be described in more detail below. The value of each output symbol is generated based on its key and on some function of one or more of the source symbols, and possibly on or more redundant symbols that had been computed from the source symbols.

The collection of source symbols that give rise to a specific output symbol are referred to herein as the output symbol's "associated symbols" or just its "associates". The selection of the function (the "value function") and the associates is done according to a process described in more detail below. Typically, but not always, M is the same for source symbols and output symbols, i.e., they both code for the same number of bits.

It should be understood that in some cases the method by which the value of an output symbol is calculated may be simply be the application of the protection function across each of the associated symbols. In another case, a number of intermediate calculations may first be performed which calculate particular combinations of source symbols and application of the function across these intermediate values and the source symbols may be used to calculate the output symbols.

In some embodiments, the number K of source symbols is used by the first encoder 115 or second encoder 116 to select the associates. Note that the number K may be different for encoders 115 and 116 since the size of source symbols and construction of source blocks may be different. If K is not known in advance, such as where the input is a streaming file, K can be just an estimate. The value K might also be used by first encoder 115 or second encoder 116 to allocate storage for source symbols and any intermediate symbols generated by first encoder 115 or second encoder 116. It should be understood that storage for source symbols in particular may be shared between encoders 115 and 116.

Encoders 115 and 116 provides output symbols to a transmit module 140. In the case that both the first and second FEC codes are systematic codes, then either First Encoder 115 or Second Encoder 116 may be configured to suppress provision of those output symbols which comprise source data in order to avoid such symbols being provided more than once to the transmission channel. Transmit module 140 is also provided the key of each such output symbol from key generators 120 and 130. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoders 115 and 116 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a hybrid decoder 155, and any data module 150 receives about the keys of these output symbols is provided to a first key regenerator 160 and a second key regenerator 161. First key regenerator 160 regenerates the first keys for the received output symbols of the first FEC code and provides these keys to hybrid decoder 155. Second key regenerator 161 regenerates the second keys for the received output symbols of the second FEC code and provides these keys to hybrid decoder 155. Hybrid decoder 155 uses the keys provided by first key regenerator 160 and second key regenerator 161 together with the corresponding output symbols, to recover the source symbols (again IS(0), IS(1), IS(2), . . . ). Decoder 155 provides the recovered source symbols to an input file reassembler 165, which generates a copy 170 of input file 101 or input stream 105.

Encoders 115 and 116 can encode data using techniques shown herein so that the FEC encoding has variable overhead.

As explained herein, the first and second FEC encoders are configured such that a decoder can extract information from both sets of FEC symbols, if they are available and the decoder is so configured or adapted, which another decoder that is not adapted to use the second set of FEC symbols can still recover errors using the first set of FEC symbols.

Hybrid Code Receiver Examples

Figure 2:
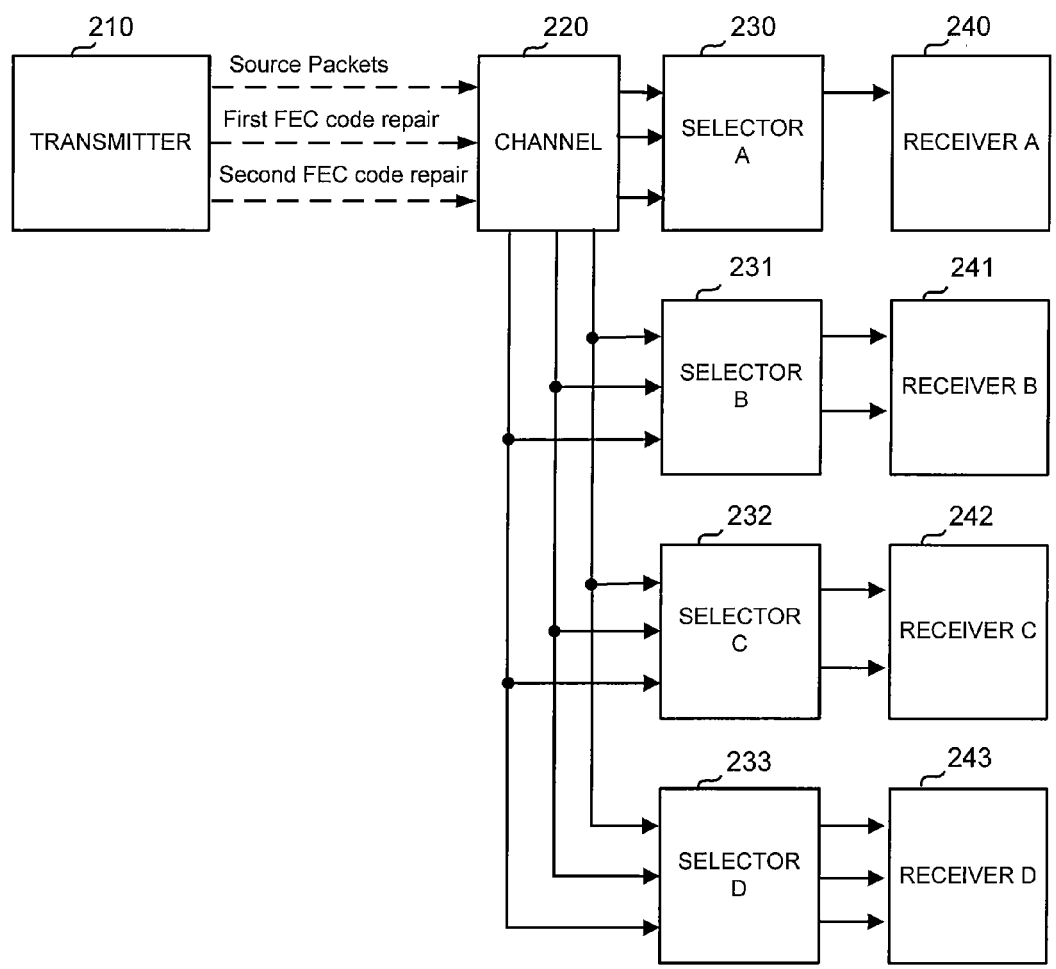
FIG. 2 is a block diagram showing a number of different receiver configurations supported by the communications system.

There are several forms of receiver that may receive and process a hybrid code. Some of these are now described with reference to FIG. 2. Transmitter 210 generates output symbols, including source symbols, first FEC code repair symbols and second FEC code repair symbols. Transmitter 210 may comprise for example elements 101, 105, 110, 130, 120, 115, 116 and 140 of FIG. 1.

Selector A 230 may receive source packets, first FEC code repair packets and second FEC repair packets from Channel 220 and provides only the source packets to Receiver A 240. Receiver A may receive source packets from Selector A 230 and if all source symbols are correctly received may recover the file or stream.

Selector B 231 may receive source packets, first FEC code repair packets and second FEC repair packets from Channel 220 and provides the source packets and the first FEC code repair packets to Receiver B 241. Receiver B 241 may receive source packets and first FEC code repair packets from Selector B 231. If not all source symbols are received, Receiver B 241 may apply a decoding operation to recover some or all of the missing source symbols by making use of the first FEC code repair packets.

Selector C 232 may receive source packets, first FEC code repair packets and second FEC repair packets from Channel 220 and provides the source packets and the second FEC code repair packets to Receiver C 242. Receiver C 242 may receive source packets and second FEC code repair packets from Selector C 232. If not all source symbols are received, Receiver C 242 may apply a decoding operation to recover some or all of the missing source symbols by making use of the second FEC code repair symbols.

Selector D 233 may receive source packets, first FEC code repair packets and second FEC code repair packets from Channel 220 and provides the source packets, the first FEC code repair packets and the second FEC code repair packets to Receiver D 243. Receiver D 243 may receive source packets, first FEC code repair packets and second FEC code repair packets from Selector D 233. If not all source symbols are received, Receiver D 243 may apply a decoding operation to recover some or all of the missing source symbols by making use of the first FEC code repair symbols, the second FEC code repair symbols or a combination of both the first and second FEC code repair symbols.

The choice of Selector and Receiver type is preferably based on the properties of the channel. For example, for a channel with very few errors it may be the case that the first FEC code alone is sufficient to recover the errors. In this case, receivers may not be provided with the capabilities required to receive and process the packets of the second FEC code. This may be an advantage as it might result in a simplified receiver design compared to a receiver capable of receiving both first and second FEC code packets and therefore the cost of designing and manufacturing such receivers may be lower.

Extensions to more than two codes should be apparent after reading this disclosure.

A receiver device may also behave according to different cases at different points in time. In particular a receiver device may change behavior between the four receiver types, Receiver A, Receiver B, Receiver C and Receiver D according to the type of Selector function that is providing it with packets. The type of Selector function may also change from time to time as is described further below.

The choice of Selector and Receiver type at any given time is preferably based on the properties of the channel. For example, for a channel with very few errors it may be the case that the first FEC code alone is sufficient to recover the errors. In this case receipt and processing of the second FEC code packets is unnecessary. Receipt and processing of the second FEC code packets at the receiver consumes resources at that receiver, for example memory to store the packets, CPU cycles to read them into memory and process them and bandwidth on the link bringing data into the receiver. Such resources may be consumed even if the packets are not eventually used for FEC decoding purposes. Therefore it is advantageous to avoid receipt and processing of these packets if they are known to be unnecessary due to the properties of the channel, since this allows those resources to be used for other tasks. Similarly, if errors on the channel are such they can be corrected using only the second FEC code then there is advantage if receipt and processing of the first FEC code packets can be avoided.

Furthermore, in some cases the errors on a channel may vary with time. In this case receivers may make a different choice of Selector and Receiver type from time to time based on the observed level of errors, in order to avoid as much as possible receipt and processing of unnecessary packets.

It may also be the case that the channel 220 effectively blocks forwarding of either First FEC code repair packets or Second FEC code repair packets. This behavior may be a property of the channel, may be based on configuration of network equipment or may be under the control of the receiver device.

An example of a case where the forwarding of packets by the channel is dependent on configuration of network equipment is a DSL network in which DSL equipment is configured with information controlling whether first FEC code packets and/or second FEC code packets should be forwarded onto each DSL line. This configuration may be based on the level of errors that are expected to occur on that line which in turn may be based on factors such as the length of the line.

An example of a case where the forwarding of packets by the channel is under the control of the receiver is an IP multicast network. In this case, packets are only forwarded by the network if the receiver has requested to join the multicast group to which they have been sent. In the case that the first FEC code repair packets and the second FEC Code repair packets are sent to different multicast groups then the reception of each kind of packet will be controlled by the receiver device. The receiver device may therefore make a selection of whether to receive first FEC code packets and second FEC code packets for example based on the observed level of errors or on its capabilities.

Additionally, once packets have been received, it is not necessarily the case that they are always required for decoding of a particular block. In some cases, the computational complexity of decoding using only the first FEC code may be different from the complexity of decoding using only the second FEC code. The computational complexity of decoding using both codes (the hybrid approach) may be different again. For example, decoding using only the first code may be relatively low in complexity, decoding using only the second code may be moderate in complexity and decoding using both codes may be high in complexity. Advantageously, a receiver may perform only the minimal required operations based on the level of losses experienced in each block.

For example, in the case of DSL networks, the number of lost packets in each block may be relatively low in number for most of the blocks, allowing the receiver to use only the first FEC code for decoding and therefore consuming very few computational resources for most of the blocks. Occasionally, there may be a sufficient number of lost packets within a block that they can only be recovered using the second FEC code packets, therefore consuming slightly more computational resources. Rarely, there may be a sufficient number of lost packets within a block that they can only be recovered using both types of FEC code packet, consuming higher computational resources but only on rare occasions.

There is considerable advantage in terms of overall computational resource usage when a hybrid code is used since the receiver is provided with several levels of error correction capability with the most commonly required capabilities requiring very low computational resources and higher computational resources only required in uncommon cases. By comparison, when only the first FEC code is available, computational resource usage is always low, but error correction capability deals with only the most common cases. Commonly, this is not sufficient since service quality targets require that even rare events should not cause errors after the Forward Error Correction has been applied.

For example, in IPTV systems, a common quality target is that there should be at most one visible artifact in some period of those, such as one hour. Since a single lost packet (after the Forward Error correction has been applied) can often cause a serious visible artifact, this target implies that the Forward Error Correction code must fail for at most one block in any hour or other period of time.

Conversely, if only the second FEC code packets are available, then error correction is sufficient to deal with less common cases, but computational complexity is moderate at all times.

The hybrid approach therefore has at least two advantages in this case. A first advantage is that computational complexity is on average low whilst simultaneously error correction capability is high. A second advantage is that the error correction capability is higher than if either code were used alone.

Decoding of Hybrid Codes

Figure 3:
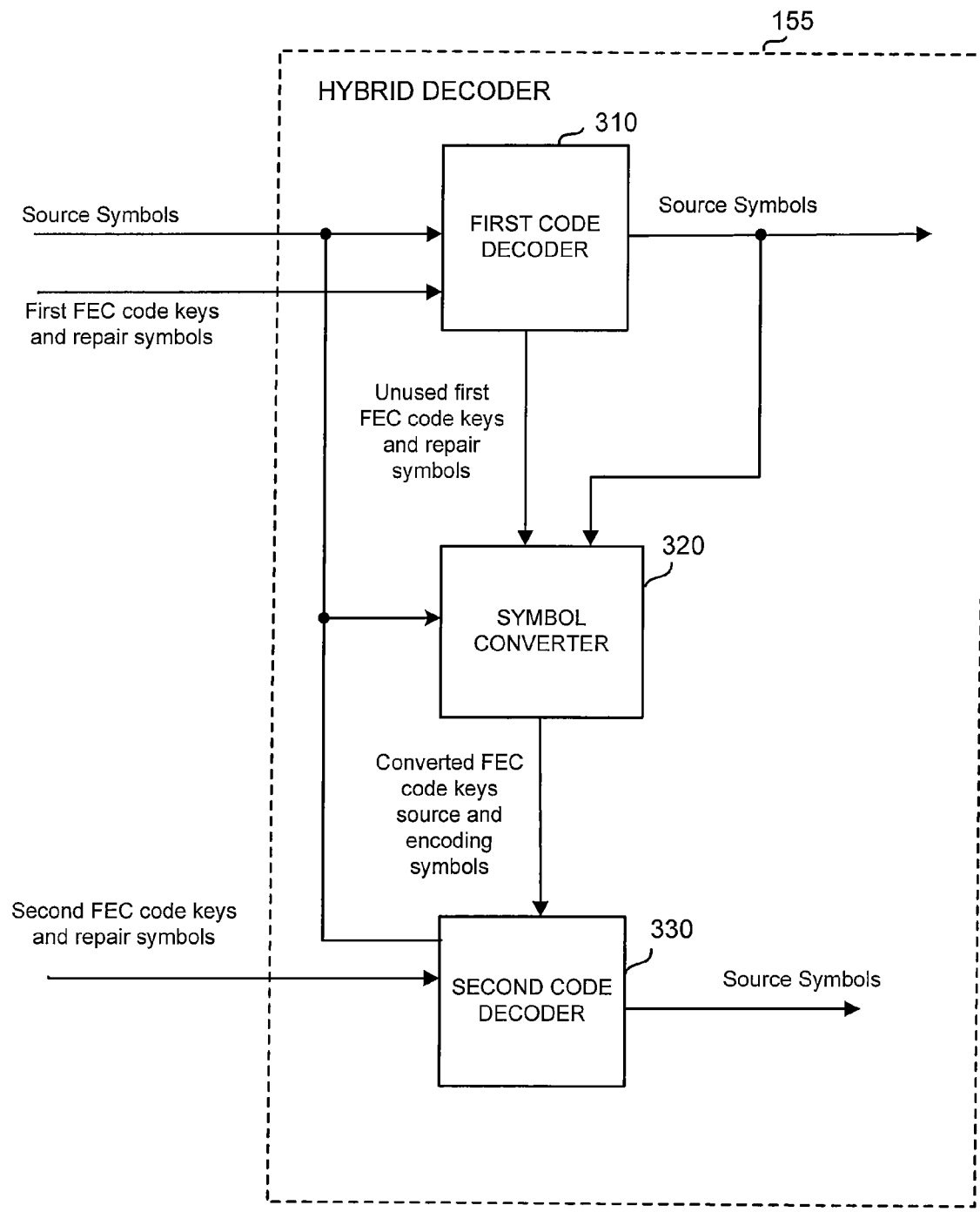
FIG. 3 is a block diagram of a decoder shown in greater detail.

FIG. 3 is a block diagram of decoder 155 shown in more detail. As illustrated there, the input to decoder 155 is a sequence of encoding symbols comprising source symbols, encoding symbols of a first FEC code, encoding symbols of a second FEC code, first FEC code keys from first key regenerator 160 and second code keys from key regenerator 161. The output of decoder 155 can be a sequence of source symbols.

Decoder 155 may comprise a first FEC decoder 310, a second FEC decoder 330 and a symbol converter 320. The input to the first FEC decoder 310 comprises source symbols, encoding symbols of a first FEC code and first FEC code keys from first key regenerator 160. The output of the first FEC decoder 310 can be source symbols, encoding symbols and first FEC code keys corresponding to the encoding symbols.

The input of the symbol converter 320, comprises source and repair symbols of the first FEC code and first FEC code keys corresponding to the encoding symbols. The output of the symbol converter 320 can be source and repair symbols suitable for use within the second code decoder and keys which describe the associated symbols for each supplied encoding symbol. These encoding symbols may have a set of associates distinct from the set of associates of any encoding symbol that may be generated by the Second FEC Encoder 116. The key associated with such an encoding symbol may also be different in type from the keys generated by the Second Key Generator 120. Herein the encoding symbols and keys provided by the Symbol Converter are referred to as "Converted FEC code keys and encoding symbols".

The input of the second FEC decoder 330 comprises source symbols, supplied directly to the Hybrid Decoder 155 or by the first FEC decoder 310, encoding symbols of the second FEC code, encoding symbols generated by the symbol converter 320, second FEC code keys generated by second FEC code key regenerator 161 and converted FEC code keys generated by symbol converter 320. The output of the second FEC decoder can be source symbols.

Symbol converter 320 transforms symbols of the first FEC code and the first FEC code keys associated with them into symbols suitable for use by the second FEC decoder 330 and the converted FEC code keys which describe the relationship between the converted symbols and the source symbols of the second FEC code. There may be a one-to-one correspondence between the encoding symbols of the first FEC code input to the symbol converter and the encoding symbols output by the symbol converter. Alternatively, there may be a one-to-many or many-to-one correspondence between the encoding symbols of the first FEC code input to the symbol converter and the encoding symbols output by the symbol converter. Information from the first FEC code keys input to the symbol converter may be used to determine the correspondence between the encoding symbols of the first FEC code supplied as input to the symbols converter and the encoding symbols output by the symbol converter, the conversion operation performed by the symbol converter and the generation of the converted FEC code keys output by the symbol converter. Information from the first FEC code keys input to the symbol converter may be used to determine the content of all or part of the encoding symbols output by the symbol converter.

We now describe a method of symbol conversion which may be employed by the symbol converter 320 in the case that the second code source symbols which can be derived from a first code source symbol each comprises a specific sequence of (not necessarily contiguous) bits of the first code source symbol, said sequences of bit positions being the same for each first code source symbol. The method comprises the following steps for each first code encoding symbol EF:

(1) the associates, $SF_0, SF_1, \ldots SF_{(d-1)}$ of the first code encoding symbol EF are identified, using the first code key (2) for each associate whose value is known, either because the source symbol was received directly or recovered by the first code decoder 310, the value of this associate may eliminated from the encoding symbol EF by means of the protection operation. This reduces the number of associates of the encoding symbol EF.

(3) for each associate, the second code source symbols which can be derived from that associate are identified. We denote the second code source symbols derived from $SF_i$ by $SS_{i,0}, \ldots, SS_{i,n}$. Each second code source symbol comprises a specific sequence of bits taken (not necessarily contiguously) from the first code source symbol $SF_i$. We denote the bit positions at which the bits comprising second code source symbol $SS_{i,j}$ are located as $B_{j0}, B_{j1}, \ldots B_{jM}$ where M is the symbol size of the source symbols of the second code.

(4) output n converted encoding symbol, where the jth converted encoding symbol $ES_j$ comprises bits $B_{j0}, B_{j1}, \ldots B_{jM}$ of first code encoding symbol EF.

(5) output n keys, where the jth key identifies the associates of $ES_j$ as $SS_{0,j}, SS_{1,j}, \ldots, SS_{(d-1),j}$.

In certain embodiments, including a specific embodiment which will be described further below, some of the bits of a second code source symbol may be derived not from a first code source symbol but instead from the first code key or may be set to specific known values. In this case, the value of these bits within the first code source symbols may be known even if the entire source symbol itself is not known. The method above may then be modified such that the specific corresponding bits of the converted encoding symbol may be calculated by applying the protection operation to the known bits of the first code source symbols, even though the remainder of the first code source symbols may not be known.

At the decoder, on receipt of a combination of zero or more source symbols and zero or more repair symbols for a source block, a method of decoding is provided comprising three steps as follows:

(1) if any symbols of the first code have been received, the first code decoder 310 checks whether any source symbols can be recovered from the first code alone, for example by applying the usual procedures for decoding of the first code. If this step recovers all the missing source symbols, then the decoding process is finished.

(2) if source symbols are still missing, the second code decoder 320 checks whether any further source symbols can be recovered from the repair symbols of the second code, for example using the usual procedures for decoding of the second code (including as input any source symbols recovered in step 1). If this step recovers all the missing source symbols, then the process is finished.

(3) if source symbols are still missing, then the remaining repair symbols of the first code are provided to the symbol converter 320 for conversion into encoding symbols that may be used by the second code decoder 330. Two methods of decoding using these additional symbols are described below, labeled Method (3a) and Method (3b). Method (3a) is applicable to a case in which the second code is represented using the generalized matrix description of systematic forward erasure code described above and Method (3b) is applicable in the case in which the second code is represented in the generalized matrix description of certain chain reaction codes, also described above.

Method (3a) comprises two steps as follows:

(3.a1) the generalized matrix for the second code is augmented by the addition of a new row for each converted encoding symbol provided by the symbol converter. The additional matrix row for a given converted encoding symbol is constructed as the matrix row which represents the linear combination of the second code source symbols which is equal to the converted encoding symbol: that is, the new matrix row has the property that the product of the new matrix row and the column vector comprising the source symbols of the second code is equal to the converted encoding symbol in question. As will be clear to those of ordinary skill in the art of linear algebra, this property uniquely characterizes the new matrix row. It should be noted that this matrix row may not be identical to the matrix row for the first code encoding symbol within the matrix description of the first code itself because the source block over which this repair symbol was constructed may be a subset of the source block over which the second code repair symbols have been constructed;

(3a.2) decoding is attempted again, using this augmented matrix.

Method (3b) comprises two steps as follows:

(3b.1) the generalized matrix for the second code is augmented by the addition of a new row for each converted encoding symbol. We first construct a row vector which represents the linear combination of second code encoding symbols which is equal to the converted encoding symbol, that is, a row vector with the property that the product of the row vector with a column vector comprising the second code source symbols is equal to the converted encoding symbol in question. Secondly, we construct the matrix consisting of those rows of the generalized matrix description of the second code which correspond to the source symbols. Thirdly, we calculate the product of the row vector constructed in the first step with the matrix constructed in the second step to obtain a new row vector. The new matrix row for the converted encoding symbol is equal to the new row vector calculated in this third step;

(3b.2) decoding is attempted again, using this augmented matrix.

In an alternative embodiment, a method of decoding is provided comprising only the steps (1) and (3) above.

Efficient Hybrid Codes Using Inactivation Decoding

In a further specific embodiment, the second code is a chain reaction code, represented in the generalized matrix form described above and decoded using the method of "inactivation decoding", such as that described in Shokrollahi II.

Many erasure codes can be efficiently decoded using a form of Gaussian Elimination known as "inactivation decoding". In a standard Gaussian Elimination process, a matrix is considered to have two regions, an unprocessed region and a processed region. At the start of the process the unprocessed region is the whole of the matrix and the processed region is empty. At each stage of the process, a non-zero pivot element, A, is chosen from among the elements of the unprocessed region of the matrix. The row containing the pivot element is known as the pivot row, $P_R$, and the column containing the pivot element is known as the pivot column, $P_C$. From this point, the pivot row is marked as processed. Then, for each row, X, intersecting the unprocessed region of the matrix which has a non-zero, unprocessed element, B, in the pivot column, then the result of multiplying the pivot row by $-BA^{-1}$ is added to row X. This last step is known as a "row operation" and is expressed as a function operation as shown in Equation 1. The pivot column is then marked as processed (i.e., removed from the unprocessed region of the matrix).

$$\text{RowOp}[P_R, X, -BA^{-1}] \quad\quad (\text{Equ. 1})$$

The resulting matrix may then be operated on by row and column exchanges such that the pivot elements lie on the diagonal in the order in which they were chosen as pivot elements. This will transform the submatrix into upper triangular form, at which point, as is well known, further row operations can be applied to reduce it to the identity matrix.

Actual decoding is realized by repeating the sequence of row operations (in the same order) on the symbols of the code, i.e., for each row operation (shown in Equation 1), the decoder adds the result of multiplying symbol $P_R$ by $-BA^{-1}$ to symbol X. The result of applying this method will be that the received encoding symbols are transformed into the intermediate symbols, from which the original source symbols can then easily be recovered. "Inactivation decoding" herein preferably refers to a decoding algorithm equivalent to the above process with the following approach for choosing the pivot element:

(1) if rows exist with only a single non-zero unprocessed element, then this element is chosen as the pivot element.

(2) if no such rows exist, then if a column exists with no non-zero elements within the processed region, and at least one non-zero element in the unprocessed region, then a non-zero element in this column in the unprocessed region is chosen as the pivot element.

(3) if no such columns exist, then any non-zero element in the unprocessed region is chosen as the pivot element.

Note that pivot columns chosen according to rule (3) above are known as "inactivated" columns. The operation of rule (2) means that they will not be chosen as pivot columns until the point at which all the columns remaining in the unprocessed part of the matrix meet the "inactivated" criteria. When this technique is used for decoding chain reaction codes, then addition of a converted encoding symbol to the decoding matrix can be efficiently achieved as follows:

(1) the above decoding process is followed until there are no non-zero elements remaining in the unprocessed region of the matrix.
(2) if the number of columns containing unprocessed elements exceeds the number of converted encoding symbols available, then decoding will not be possible and the process stops.
(3) a new row is added to the matrix for each converted encoding symbol. An element in such a new row, a, in column b, is considered processed if and only if there are no unprocessed elements in the rest of column b. As noted above, each converted encoding symbol is equal to a linear combination of the second code source symbols. The matrix row for the first code symbol is constructed as the same linear combination of the original matrix rows for the source symbols as follows: We first construct a row vector which represents the linear combination of second code encoding symbols which is equal to the converted encoding symbol, that is, a row vector with the property that the product of the row vector with a column vector comprising the second code source symbols is equal to the converted encoding symbol in question. Secondly, we construct the matrix consisting of those rows of the generalized matrix description of the second code which correspond to the source symbols. Thirdly, we calculate the product of the row vector constructed in the first step with the matrix constructed in the second step to obtain a new row vector. The new matrix row for the converted encoding symbol is equal to the new row vector calculated in this third step.
(4) For each processed element, B, in one of the new first repair symbol rows, there is a unique row R among the rows corresponding to chain reaction code symbols (source, repair or static) which has a non-zero element, A, in the same column as B. The result of multiplying row R by $-BA^{-1}$ is then added to the first repair symbol row.
(5) The processed elements of the new first repair symbol rows are now zero and if there are non-zero elements among the unprocessed elements then the Gaussian elimination process can continue with this new augmented matrix.

Examples of First FEC Codes
Parity Code

In this case, first FEC code symbols are calculated as the XOR of a number of source symbols. In many cases, each source data packet sent contains a number, G, of consecutive source symbols. Suppose there are K source symbols in total, $S_0$ to $S_{K-1}$ and the largest number of source symbols placed into a single packet is $G_{max}$. Define $G_{max}$ first code repair symbols, $R_i$ for $i=0, \ldots, (G_{max}-1)$ as shown in Equation 2.

$$R_i = \text{sum}\{S_j; 0<=j<K \text{ and } (j\%G_{max})=\} \quad \text{(Equ. 2)}$$

The $G_{max}$ first code repair symbols are placed into a single packet. Receipt of these P first code source symbols allows any consecutive set of P lost repair symbols to be recovered, and thus a single lost source packet can be recovered using the first code repair packet.

Interleaved Parity Code

In this case, first code encoding symbols are calculated as the XOR of a number of source symbols. In many cases, each source data packet sent contains a number, G, of consecutive source symbols. Suppose there are K source symbols in total, $S_0$ to $S_{K-1}$ and the largest number of source symbols placed into a single packet is $G_{max}$. Suppose the interleaving depth required is D. Define $D \cdot G_{max}$ prefix code repair symbols, $R_i$ for $i=0, (D \cdot G_{max}-1)$ as shown in Equation 3.

$$R_i = \text{sum}\{S_j; 0<=j<K \text{ and } (j\%G_{max})=(1\%G_{max}) \text{ and } \text{floor}(j/G_{max}) \% D = \text{floor}(I/G_{max})\} \quad \text{(Equ. 3)}$$

The $D \cdot G_{max}$ first code repair symbols are placed into D packets, each packet containing $G_{max}$ symbols, such that the first packet contains symbols $0, \ldots, G_{max}-1$, the second packet contains symbols $G_{max}, \ldots 2 \cdot G_{max}-1$ etc.

Other Well-Known Parity Codes

Many parity codes are known within particular application areas. For example RFC 2733 describes examples of codes. Codes described in the "Professional-MPEG Code of Practice 3" might be used with streams of RTP packets.

As will be clear to those of skill in the art upon review of this disclosure, parity symbols which are equal in value to symbols constructed according to the method above may be extracted from the packets generated by these codes, even if the source block structure used by the second code is not exactly the same as that used by the prefix code. In particular, these codes define for each packet a block of data (referred to herein as "source packet information") and perform XOR operations across the source packet information of multiple packets to obtain a parity symbol. As previously described, this source packet information may or may not be equal to a specific set of source symbols from the perspective of the second FEC code. However, so long as at least some portion of the first code source packet information is equal to a set of source symbols of the second code, and so long as the portions are aligned across the source packet information of different packets, then the resulting parity packets will contain data corresponding to parity symbols constructed as the XOR or source symbols of the second FEC code, and thus the combination technique may be applied.

Thus, in another embodiment, codes such as these may be used as a first code without modification to the code and the packetization structure used by that code.

Reed-Solomon Codes

It is well known that Reed-Solomon codes may be constructed according to the generalized matrix description of systematic erasure codes as presented above. However, it should be understood that implementations according to the present invention are not limited to those that use Reed-Solomon codes.

Codes can be constructed using Cauchy matrices or Vandermonde matrices converted into systematic form. Such codes may therefore be used as first FEC codes within a hybrid code.

In general, Reed-Solomon codes are calculated over finite fields larger than GF(2), for example GF(16) or GF(256). Chain reaction codes that operate only over GF(2) are well known. For example, see those described (Luby II and Luby III). In the case of a hybrid code built from a first FEC code constructed over one field and a second code constructed of a different (smaller or larger) field, it is then necessary to transform the matrix into a matrix over the largest field used at the appropriate point during the Gaussian elimination. This can always be done provided there exists an embedding of the smaller field into the larger one—which is generally the case with the fields employed in such codes. For example there is a trivial embedding of GF(2) into GF(256) in which the zero element of GF(2) is mapped to the zero element of GF(256) and the identify element of GF(2) mapping to the identity element of GF(256). Techniques for handling such matrices built from multiple finite fields in the context of erasure coding are described in the references cited above (Luby III, Shokrollahi I, Shokrollahi II, and possibly others) and may be applied to the case of hybrid codes.

Examples of Second FEC Codes

The second FEC code used in the hybrid code schemes described here may be any of many forward erasure correction codes which are known in the art. For example, the second FEC codes chain reaction codes such as LT Codes and Raptor Codes or fixed rate codes such as Reed-Solomon codes, Low-Density Parity Check Codes, LDGM Staircase and LDGM Triangle codes.

Examples of Hybrid Codes

As will be clear from the above examples of first and second codes, many examples of hybrid codes can be given by choosing any of the first codes and any of the second codes. A specific example would be a simple parity code combined with a chain reaction code such as Raptor codes. Another example would be an interleaved parity code combined with a chain reaction code. A further example would be the Professional-MPEG Code of Practice 3 code combined with a chain reaction code. A further example would be a Reed-Solomon code combined with a chain reaction code. Other examples include: a simple parity code combined with a Reed-Solomon code, a Reed-Solomon code combined with a LDPC or LDGM code, a simple parity code combined with a LDPC or LDGM code. An example of a triple hybrid code is: the first code is a simple parity code, the second code is a Reed-Solomon code, and the third code is an LDPC, LDGM or chain reaction code.

In a specific embodiment of an encoder or decoder wherein FEC protection is provided to an RTP stream, the first FEC code is a code described in the Pro-MPEG Code of Practice 3 [Pro_MPEG] and SMPTE standard 2022-1, which is a simple interleaved parity code, and the second FEC code is a Raptor code, which is a multi-stage chain reaction code.

In this embodiment, the second code is a variation of an FEC streaming system described in Luby II. The source symbols of this code may be smaller than those of the first FEC code. In a system described in Luby II, a source block is constructed, comprising for each source packet:
  A flow identifier
  A packet length indicator
  The UDP Payload of the packet
  Padding bytes Data included within the source block corresponding to a single packet is referred to as "Source Packet Information".

In this embodiment, the system protects a single flow of RTP packets. As a result, the flow identifier takes a single fixed value for every packet which is known to encoder and decoder, which may be zero and is assumed to be zero hereinafter. Furthermore, the packet length indicator used in this embodiment is the RTP payload length. As will be clear on review of the referenced specifications, the restrictions implied by the first code require a straightforward relationship between the RTP payload length and UDP payload length.

In the case that a receiver receives FEC repair packets from both the first and second codes, then a hybrid decoding approach may be provided. The following procedures may be followed to achieve this and are included here as a specific embodiment of the generalized hybrid approach described above.

In an example of hybrid decoding, it proceeds in three steps:

Step 1: SMPTE 2022-1 Decoding

In this step, the packets encoded according to SMPTE 2022-1, together with the received source packets, are processed as usual to recover zero of more source packets.

Step 2: Raptor Decoding

In this step, if source packets are still missing, then packets encoded according to Raptor, together with the received source packets and any source packets which were recovered in Step 1, are processed using Raptor decoding procedures.

Step 3: Hybrid Decoding

In this step, if source packets are still missing, then remaining (unprocessed) SMPTE 2022-1 packets are converted to a form in which they can be added to the Raptor decoding process, and Raptor decoding is then continued.

Conversion of SMPTE 2022-1 packets and their use in Raptor decoding are described in the following sections.

As will be clear to those of skill in the are of erasure coding, the three steps above may involve increasingly complex calculations, step (1) being the simplest and step (3) being the most complex. An advantage of the method described above is that the more complex steps are performed only if required based on the set of received packets. Thus the computational complexity of the decoding method is on average much lower than if, for example, the second code were used alone.

In an alternative embodiment, only steps 1 and 3 are performed.

Conversion of SMPTE 2022-1 Packets

The objective of this conversion operation of SMPTE 2022-1 packets is to convert them into a form such that they can be included in the Raptor decoding process. According to SMPTE 2022-1, each FEC packet is constructed by applying a protection operation, based on the exclusive OR operation (XOR), to a number, D, of the source packets (the "protected packets"). The UDP payload of the SMPTE 2022-1 packet contains the following data (amongst other fields):
  An FEC header containing:
    The Length Recovery field, which is the XOR of the RTP payload lengths of the protected packets
    The XOR of the Payload Type (PT) fields of the RTP headers of the protected packets
    The XOR of the Timestamp (TS) fields of the RTP headers of the protected packets
  The XOR of the RTP payloads of the protected packets In the first step of the conversion operation, the fields of each received or recovered source packet protected by a received SMPTE 2022-1 FEC packet, are XORed into the corresponding fields of the FEC packet. After this operation, the fields of the FEC packet are each equal to the XOR of the corresponding fields of the remaining (unrecovered) protected packets (which we call the "unrecovered protected packets").

In the second step of the conversion operation, for each remaining SMPTE 2022-1 FEC packet, the following fields are concatenated to form a 'virtual' Raptor repair packet payload:
  A single zero byte
  A two byte length indication, which is equal to the XOR of the RTP payload lengths of the unrecovered protected packets, taken directly from the SMPTE 2022-1 FEC packet
  A two-bit field, which is equal to the XOR of the RTP Version fields of the unrecovered protected packets. This is equal to zero if the number of unrecovered protected packets is even and 2 otherwise.

Seven (7) zero bits, corresponding to the XOR of the RTP Padding (P), Extension (X), CSRC Count (CC) and Marker (M) bits of the unrecovered protected packets, which are all required to be zero according to SMPTE 2022-1.

A seven (7) bit field equal to the XOR of the RTP Payload Type (PT) fields of the unrecovered protected packets (taken directly from the corresponding field of the SMPTE 2022-1 FEC header).

A 16-bit field equal to the XOR of the RTP Sequence Number fields of the unrecovered protected packets. The Sequence Numbers of the unrecovered protected packets can be explicitly calculated based on the SNbase, offset and NA values of the FEC header of the FEC packet as per SMPTE 2022-1.

A 32-bit field equal to the XOR of the RTP Timestamp (TS) fields of the unrecovered protected packets (taken directly from the corresponding field of the SMPTE 2022-1 FEC header).

A 32-bit field equal to the XOR of the RTP SSRC fields of the unrecovered protected packets. This is equal to zero if the number of unrecovered protected packets is even and equal to the SSRC of the stream otherwise.

The XOR of the RTP payloads of the unrecovered protected packets, taken directly from the remainder of the SMPTE 2022-1 FEC packet A number of zero-valued padding bytes, such that the total length of the "virtual" repair packet payload is equal to the length of the other Raptor repair packet payloads (which are required to all be the same according to SectionE.4.3.2.5).

The resulting "virtual" repair packet payload is then equal to the XOR of the Source Packet Information of the unrecovered protected packets.

Extension of Raptor Decoding

A possible Raptor decoding algorithm is described in Luby II in terms of a Gaussian Elimination process upon a matrix A. As will be clear to those of skill in the art of linear algebra, this method is equivalent to the method of "inactivation decoding" described herein. If decoding is not possible without use of the SMPTE 2022-1 packets, then this decoding process will fail during the "second phase" described in Luby II. At this point, the matrix A has less than L non-zero rows (Note, the symbol L here denotes the number of intermediate symbols of the Raptor code, not the L value associated with the SMPTE 2022-1 packets).

Let G be the number of symbols per packet (which can be calculated as the Raptor repair packet payload size divided by the symbol size). Then each "virtual" Raptor repair packet constructed above, in this example, consists of exactly G new symbols, each of which is the XOR of exactly $N_s$ source symbols (which we call the "unrecovered protected symbols"), where $N_s$ is the number of unrecovered protected packets associated with the SMPTE 2022-1 FEC packet from which the "virtual" Raptor repair packet was constructed.

For each such new symbol, a new row is added to the decoding matrix A. This row is constructed as follows:
 The row is initialized to zero
 For each of the $N_s$ unrecovered protected symbols, the LTEnc generator is used to determine the set of intermediate symbols whose sum is equal to the unrecovered protected symbol. For each such intermediate symbol a '1' is XORed into the appropriate position of the new row Phase two of the decoding process is then continued with these additional rows and symbols.

Advantages of Hybrid Coding:

In general, a hybrid coding system encodes according to two (or more) codes, wherein at least one code is more complex than the other(s). Where two codes are used (the extensions to more than two should be apparent from reading this disclosure), the source data is encoded according to a simple code and according to a complex code. The transmission is of the source data, FEC repair packets of the first simple code and FEC repair packets of the second complex code (assuming systematic coding; nonsystematic coding might be used as well). A decoder can use one or both sets of FEC repair packets independently, and under some conditions, the recovery using both sets together is greater than what is possible using either one alone.

Advantages of this approach have been described above, including:
 a variety of receiver types may be deployed, making use of any subset of the provided codes within the hybrid code (for example, either, neither or both of the codes in the case of a hybrid of two codes). This is advantageous because receivers can be adapted to particular conditions and in particular lower complexity, and hence lower cost, receiver can be provided for less challenging environments whilst higher complexity and hence higher cost receivers can be provided for more challenging environments. This is a particular advantage in scenarios where a single transmission will be received by many receivers experiencing different conditions in terms of packet loss and where the conditions in terms of packet loss are relatively static for each receiver. An example would be IPTV deployments of DSL networks. This is also an advantage in the case of network upgrades, where lower complexity receivers may be deployed first and higher complexity receiver introduced later avoiding the "flag day" problem described in detail above.
 the set of encoding symbols received and processed by a receiver may be adapted to the conditions in terms of packet loss experienced by that receiver, either through static configuration or dynamically under the control of the receiver or another entity. This is an advantage because resource usage at the receiver for FEC may be reduced to the minimum necessary according to the conditions for that receiver thereby saving resources in comparison to alternative approaches which might require receipt and processing of all the FEC code symbols irrespective of the conditions.
 the set of encoding symbols actually used in a decoding operation may be adapted to the requirements of that particular decoding operation, for example by choosing to use only the symbols of the lower complexity code in the case that these symbols alone are sufficient to complete the decoding operation.

A particular advantage of the hybrid approach described herein is that the advantages above may be combined with overall error correction performance which is equivalent to or better than either code applied alone.

Figure 5:
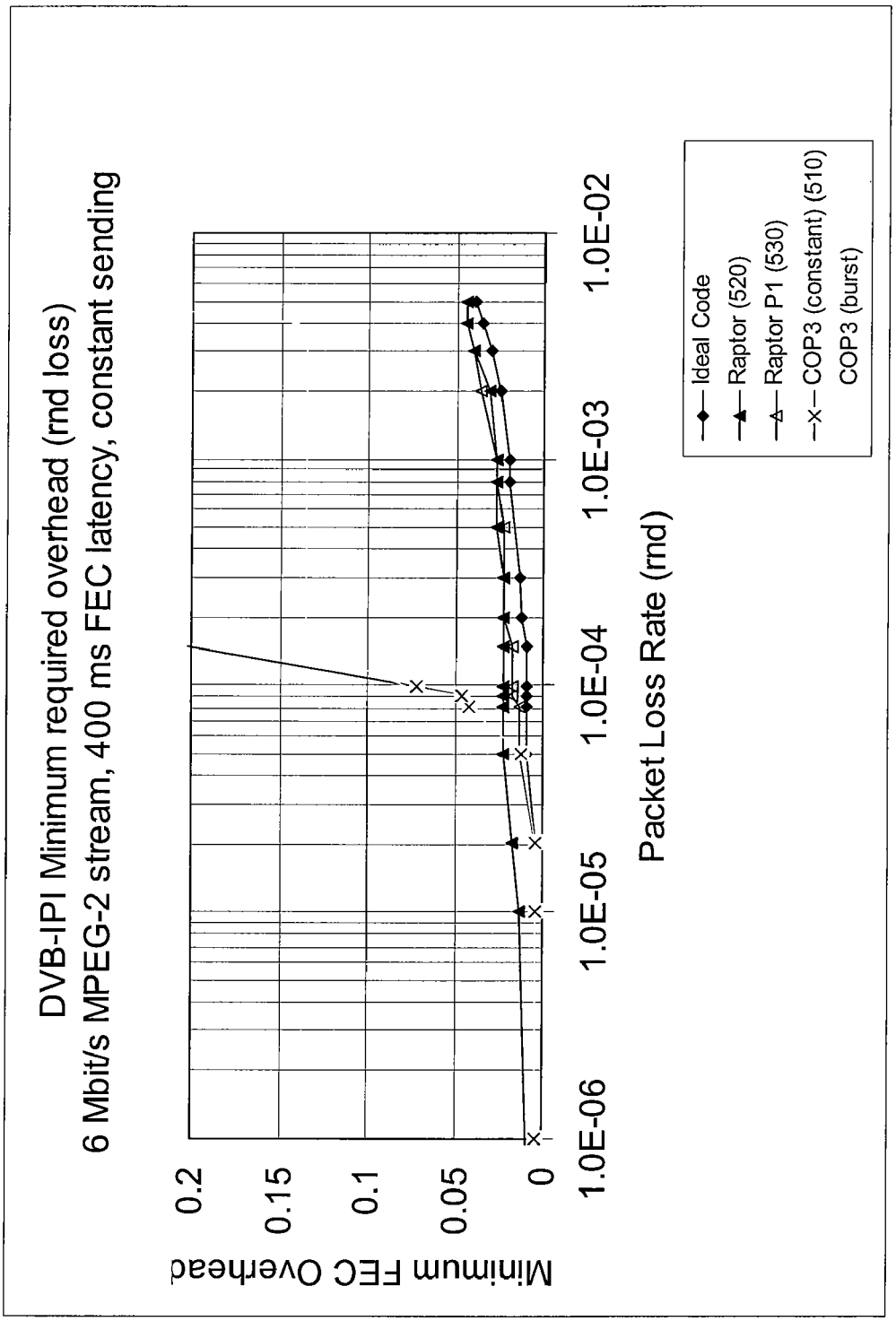
FIG. 5 provides some example performance results for the hybrid coding processes.

FIG. 5 provides error correction performance results for several codes, including the Pro-MPEG Code Of Practice 3 code (510), the Raptor code (520) and a hybrid code (530) in which the codes 510 and 520 are used as first and second code respectively. The figure shows results for a scenario typical for IPTV in which a 6 Mbit/s video stream is encapsulated into IP data packets and sent over a network with FEC protection provided using source blocks each containing 400 ms of video data. The simulated packet loss rate is plotted on the x-axis and for each packet loss rate and each code the amount of FEC overhead required to meet a typical IPTV quality target of an average of one packet loss every four hours is shown.

For example, the point labeled 510 indicates that the Pro-MPEG Code of Practice 3 code required an FEC overhead of just over 4% in order to achieve the quality target at a packet loss rate of $8 \times 10^{-5}$.

The hybrid code shown in this figure was constructed by sending one repair packet for each block constructed using the first (Pro-MPEG) packet and additional repair packets (if required) using the second (Raptor) code. The figure shows that the overhead required by the hybrid code 530 is in all cases less than or equal to the overhead required by either the first code (510) or second code (520) alone.

Note that the plot for the hybrid code 530 is coincident with that for the first code 510 for packet loss rates less than or equal to $2 \times 10^{-5}$. This illustrates that at those low loss rates the first code alone is sufficient.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of encoding data for transmission from a source to a destination over a communications channel, the method comprising:
    obtaining an ordered set of source symbols representing the data to be encoded using the generated output symbols and an encoding for the data;
    generating FEC repair data according to a first code;
    generating FEC repair data according to a second code, the second code being more complex than the first code; and
    sending the source symbols, the first set of FEC repair data and the second set of FEC repair data, such that received data that includes some or all of the sent data is decodable and the original source block of data is recoverable, wherein the first and second sets of FEC repair data are constructed such that the original source block of data is recoverable with less information than would be required if using the received FEC repair data from only one of the two FEC codes and the FEC decoder for that FEC code and the received original source block data.

2. The method of claim 1, wherein the first FEC code is a simple parity code and the second FEC code is a chain reaction code.

3. The method of claim 1, wherein the first FEC code is a simple parity code and the second FEC code is a Reed-Solomon code.

4. The method of claim 1, wherein the first FEC code is a Reed-Solomon code and the second FEC code is a LDPC, LDGM or chain reaction code.

5. The method of claim 1, wherein an FEC decoder for the first FEC code is inherently much simpler than an FEC decoder for the second FEC code.

6. The method of claim 1, wherein the FEC decoder for the received data at the receiver has approximately the same complexity as an FEC decoder for the second FEC code.

7. The method of claim 1, wherein a second receiver that receives original source block data and FEC repair data for only the first FEC code can more often fully recover the original source block than a receiver that only receives original source block data.

8. An encoder that encodes data for transmission from a source to a destination over a communications channel, the encoder comprising:
    an input for receiving an ordered set of source symbols representing the data to be encoded;
    first logic for generating a first set of repair data generated from the source symbols according to a first FEC code;
    second logic for generating a second set of repair data generated from the source symbols according to a second FEC code, the second FEC code being more complex than the first FEC code where complexity is a measure of computational effort required to generate repair symbols; and
    an output for outputting at least the first set of repair data and the second set of repair data,
    wherein the first and second sets of repair data are constructed such that the original ordered set of source symbols is recoverable with less information than would be required if using the received FEC repair data from only one of the first and second set of repair data.

9. The encoder of claim 8, wherein the first FEC code is a simple parity code and the second FEC code is a chain reaction code.

10. The encoder of claim 8, wherein the first FEC code is a simple parity code and the second FEC code is a Reed-Solomon code.

11. The encoder of claim 8, wherein the first FEC code is a Reed-Solomon code and the second FEC code is a LDPC, LDGM or chain reaction code.

12. A decoder for decoding information received over a communications channel, possibly with errors and/or erasures and/or lost or missing information, from an encoder, the decoder comprising:
    an input for receiving symbols from the communications channel;
    logic for identifying whether a received symbol represents a source symbol of the encoded data, a first type of repair symbol for recovering lost, incorrect or missing information of the encoded data or a second type of repair symbol for recovering lost, incorrect or missing information of the encoded data, wherein the first type of repair symbol is a repair symbol generated from the source symbols according to a first FEC code and the second type of repair symbol is a repair symbol generated from the source symbols according to a second FEC code, the second FEC code being more complex than the first FEC code where complexity is a measure of computational effort required to generate repair symbols; and
    logic for using at least the received source symbols, at least one repair symbol of the first type and at least one repair symbol of the second type to recover the encoded data, such that the encoded data is recovered with less information than would be required if only one of the first type of repair symbol or the second type of repair symbol are used.

13. The decoder of claim 12, wherein the first FEC code is a simple parity code and the second FEC code is a chain reaction code.

14. The decoder of claim 12, wherein the first FEC code is a simple parity code and the second FEC code is a Reed-Solomon code.

15. The decoder of claim 12, wherein the first FEC code is a Reed-Solomon code and the second FEC code is a LDPC, LDGM or chain reaction code.

16. A method of decoding transmitted data that encodes for a set of source symbols transmitted over a communications channel, the method comprising:
   receiving symbols from the communications channel;
   identifying whether a received symbol represents a source symbol of the encoded data, a first type of repair symbol for recovering lost, incorrect or missing information of the encoded data or a second type of repair symbol for recovering lost, incorrect or missing information of the encoded data, wherein the first type of repair symbol is a repair symbol generated from the source symbols according to a first FEC code and the second type of repair symbol is a repair symbol generated from the source symbols according to a second FEC code, the second FEC code being more complex than the first FEC code where complexity is a measure of computational effort required to generate repair symbols; and
   using at least the received source symbols, at least one repair symbol of the first type and at least one repair symbol of the second type to recover the encoded data, such that the encoded data is recovered with less information than would be required if only one of the first type of repair symbol or the second type of repair symbol are used.

17. The method of claim 16, wherein the first FEC code is a simple parity code and the second FEC code is a chain reaction code.

18. The method of claim 16, wherein the first FEC code is a simple parity code and the second FEC code is a Reed-Solomon code.

19. The method of claim 16, wherein the first FEC code is a Reed-Solomon code and the second FEC code is a LDPC, LDGM or chain reaction code.

20. A system for encoding data for transmission from a source to a destination over a communications channel, the system comprising:
   means for generating from an ordered set of source symbols FEC repair data according to a first code, the ordered set of source symbols representing the data to be encoded;
   means for generating from the ordered set of source symbols FEC repair data according to a second code, the second code being more complex than the first code; and
   means for sending the source symbols, the first set of FEC repair data and the second set of FEC repair data, such that received data that includes some or all of the sent data is decodable and the original source block of data is recoverable, wherein the first and second sets of FEC repair data are constructed such that the original source block of data is recoverable with less information than would be required if using the received FEC repair data from only one of the two FEC codes and the FEC decoder for that FEC code and the received original source block data.

21. The system of claim 20, wherein the first FEC code is a simple parity code and the second FEC code is a chain reaction code.

22. The system of claim 20, wherein the first FEC code is a simple parity code and the second FEC code is a Reed-Solomon code.

23. The system of claim 20, wherein the first FEC code is a Reed-Solomon code and the second FEC code is a LDPC, LDGM or chain reaction code.

24. A system for decoding transmitted data that encodes for a set of source symbols transmitted over a communications channel, the system comprising:
   means for receiving symbols from the communications channel;
   means for identifying whether a received symbol represents a source symbol of the encoded data, a first type of repair symbol for recovering lost, incorrect or missing information of the encoded data or a second type of repair symbol for recovering lost, incorrect or missing information of the encoded data, wherein the first type of repair symbol is a repair symbol generated from the source symbols according to a first FEC code and the second type of repair symbol is a repair symbol generated from the source symbols according to a second FEC code, the second FEC code being more complex than the first FEC code where complexity is a measure of computational effort required to generate repair symbols; and
   means for using at least the received source symbols, at least one repair symbol of the first type and at least one repair symbol of the second type to recover the encoded data, such that the encoded data is recovered with less information than would be required if only one of the first type of repair symbol or the second type of repair symbol are used.

25. The system of claim 24, wherein the first FEC code is a simple parity code and the second FEC code is a chain reaction code.

26. The system of claim 24, wherein the first FEC code is a simple parity code and the second FEC code is a Reed-Solomon code.

27. The system of claim 24, wherein the first FEC code is a Reed-Solomon code and the second FEC code is a LDPC, LDGM or chain reaction code.

28. A computer program product for encoding data for transmission from a source to a destination over a communications channel, the product comprising:
   a processor-readable medium storing processor-readable instructions configured to cause a processor to:
      obtain an ordered set of source symbols representing the data to be encoded using the generated output symbols and an encoding for the data;
      generate FEC repair data according to a first code;
      generate FEC repair data according to a second code, the second code being more complex than the first code; and
      provide for sending the source symbols, the first set of FEC repair data and the second set of FEC repair data, such that received data that includes some or all of the sent data is decodable and the original source block of data is recoverable, wherein the first and second sets of FEC repair data are constructed such that the original source block of data is recoverable with less information than would be required if using the received FEC repair data from only one of the two FEC codes and the FEC decoder for that FEC code and the received original source block data.

29. The computer program product of claim 28, wherein the first FEC code is a simple parity code and the second FEC code is a chain reaction code.

30. The computer program product of claim 28, wherein the first FEC code is a simple parity code and the second FEC code is a Reed-Solomon code.

31. The computer program product of claim 28, wherein the first FEC code is a Reed-Solomon code and the second FEC code is a LDPC, LDGM or chain reaction code.

32. A computer program product for decoding transmitted data that encodes for a set of source symbols transmitted over a communications channel, the product comprising:

a processor-readable medium storing processor-readable instructions configured to cause a processor to:
  obtain symbols received from the communications channel;
  identify whether a received symbol represents a source symbol of the encoded data, a first type of repair symbol for recovering lost, incorrect or missing information of the encoded data or a second type of repair symbol for recovering lost, incorrect or missing information of the encoded data, wherein the first type of repair symbol is a repair symbol generated from the source symbols according to a first FEC code and the second type of repair symbol is a repair symbol generated from the source symbols according to a second FEC code, the second FEC code being more complex than the first FEC code where complexity is a measure of computational effort required to generate repair symbols; and
  use at least the received source symbols, at least one repair symbol of the first type and at least one repair symbol of the second type to recover the encoded data, such that the encoded data is recovered with less information than would be required if only one of the first type of repair symbol or the second type of repair symbol are used.

33. The computer program product of claim 32, wherein the first FEC code is a simple parity code and the second FEC code is a chain reaction code.

34. The computer program product of claim 32, wherein the first FEC code is a simple parity code and the second FEC code is a Reed-Solomon code.

35. The computer program product of claim 32, wherein the first FEC code is a Reed-Solomon code and the second FEC code is a LDPC, LDGM or chain reaction code.

* * * * *